United States Patent
Canegallo et al.

(10) Patent No.: US 8,150,315 B2
(45) Date of Patent: Apr. 3, 2012

(54) METHOD FOR VERIFYING THE ALIGNMENT BETWEEN INTEGRATED ELECTRONIC DEVICES

(75) Inventors: Roberto Canegallo, Rimini (IT); Mauro Scandiuzzo, Trento (IT); Eleonora Franchi Scarselli, Bologna (IT); Antonio Gnudi, Bologna (IT); Roberto Guerrieri, Bologna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 102 days.

(21) Appl. No.: 12/826,571

(22) Filed: Jun. 29, 2010

(65) Prior Publication Data

US 2011/0319015 A1   Dec. 29, 2011

(51) Int. Cl.
    *H04B 5/00*   (2006.01)
(52) U.S. Cl. ........... 455/41.1; 455/20; 455/65; 455/260; 455/265; 455/23; 455/75; 455/502; 375/257; 375/327; 438/381; 438/107; 438/129; 257/797; 257/528; 257/532; 324/662; 324/679
(58) Field of Classification Search ................. 455/41.1, 455/20, 65, 260, 265, 23, 502, 75
See application file for complete search history.

(56) References Cited

U.S. PATENT DOCUMENTS

| | | | |
|---|---|---|---|
| 6,518,679 B2 * | 2/2003 | Lu et al. .................. | 257/797 |
| 6,870,271 B2 * | 3/2005 | Sutherland et al. ........... | 257/777 |
| 6,875,640 B1 * | 4/2005 | Farnworth et al. ........... | 438/127 |
| 6,916,719 B1 * | 7/2005 | Knight et al. ................. | 438/381 |
| 6,972,596 B1 * | 12/2005 | Proebsting et al. ............. | 326/83 |
| 7,067,910 B2 | 6/2006 | Drost et al. | |
| 7,200,830 B2 | 4/2007 | Drost et al. | |
| 7,456,637 B2 * | 11/2008 | Canegallo et al. ............. | 324/662 |
| 2002/0191835 A1 | 12/2002 | Lu et al. | |
| 2005/0075080 A1 | 4/2005 | Zhang | |
| 2007/0067115 A1 | 3/2007 | Canegallo et al. | |
| 2007/0092011 A1 | 4/2007 | Ciccarelli et al. | |
| 2008/0225987 A1 | 9/2008 | Fazzi et al. | |
| 2009/0168860 A1 | 7/2009 | Magagni et al. | |
| 2009/0168938 A1 | 7/2009 | Ciccarelli et al. | |

OTHER PUBLICATIONS

Franchi et al., "3D Capacitive Transmission of Analog Signals with Automatic Compensation of the Voltage Attenuation," Proceedings of the 1998 IEEE International Symposium on Circuits and Systems, May 31-Jun. 3, 1998, 4 pages.

* cited by examiner

*Primary Examiner* — Marceau Milord

(74) *Attorney, Agent, or Firm* — Seed IP Law Group PLLC

(57) ABSTRACT

A method for verifying alignment between first and second integrated devices coupled together using a reference and a coupling capacitor, including: transmitting a reference signal on a transmission electrode of the reference capacitor; receiving a coupling signal on a reception electrode of the reference capacitor; amplifying the coupling signal, generating a reception reference signal; generating a reception control signal as a function of the reception reference signal; transmitting a communication signal on an electrode of the coupling capacitor; receiving a reception signal on an electrode of the coupling capacitor; amplifying the reception signal, generating a first compensated signal; controlling a level of amplification of amplifying the coupling signal and the reception signal as a function of the reception control signal; and detecting a possible misalignment between the first and second devices based on an amplitude of the communication signal and an amplitude of the compensated signal.

34 Claims, 7 Drawing Sheets

METHOD FOR VERIFYING THE ALIGNMENT BETWEEN INTEGRATED ELECTRONIC DEVICES

BACKGROUND

1. Technical Field

The present disclosure relates to a method for verifying the alignment between integrated electronic devices.

2. Description of the Related Art

There are available techniques that enable stacking of a number of integrated electronic circuits ("chips"), in such a way as to form a so-called three-dimensional structure, with evident benefits in terms of reduction of the space occupied by the chips; these techniques are commonly known as 3D stacking and are preparatory to the achievement of the so-called 3D packaging, i.e., of the three-dimensional structures.

Within single three-dimensional structures, it is moreover possible to connect the chips contained therein in such a way as to enable exchange of signals between the chips themselves. For this purpose, it is possible to resort to systems of communication between chips, i.e., communications systems that enable communications of a so-called "inter-chip" type, thanks to the presence of a coupling between two or more chips. The coupling can be of a so-called "contact" type, i.e., of an ohmic type, in which case it can be implemented by one or more of the following: through silicon vias (TSVs), bumps, pillar bumps, etc. Alternatively, the coupling can be of a so-called "contactless" type, i.e., for example, of an inductive or capacitive type.

Irrespective of the coupling type, in order to optimize the communications between the chips present in a given three-dimensional structure, it is important for the chips to be properly stacked to form the three-dimensional structure. In fact, a possible misalignment between two or more chips, may not only prevent a correct packaging of the three-dimensional structure, but may also involve a reduction in the possibility of carrying out communications between the chips of the three-dimensional structure, given that the corresponding couplings may be damaged on account of misalignment.

By way of example, FIG. 1 shows a misalignment within a structure formed by a first chip IC1 and a second chip IC2, for example, introduced during the packaging (or stacking) of the first and second chips IC1, IC2. In practice, with respect to the reference system x, y, z shown in FIG. 1, the first chip IC1 is translated with respect to the second chip IC2 by a deviation $\Delta x$ along the axis x of the reference system x, y, z. In addition, whereas the second chip IC2 is correctly aligned to the reference system x, y, z, i.e., it has respective principal axes x", y", z" aligned with the corresponding axes of the reference system x, y, z, the first chip IC1 is rotated by an angle $\phi$ with respect to the reference system x, y, z, and hence is tilted by the angle $\phi$ with respect to the second chip IC2. In particular, the first chip IC1 has respective principal axes x', y', z', and the axes x' and z' are rotated by the angle $\phi$ with respect to the axes x and z, respectively. This rotation contributes to the misalignment between the first chip IC1 and the second chip IC2. In a similar way, the first chip IC1 can likewise be rotated with respect to the second chip IC2 by an angle $\theta$ (not shown), formed by the plane defined by the axes y' and z' and by the plane defined by the axes y" and z".

In a way similar to what has been described in regard to the chips, techniques enable stacking of a number of dice, where by "die" is meant the result of the step of "dicing" commonly used in the processes of formation of the die. In practice, it is today possible to obtain three-dimensional structures formed by a number of dice, in a way similar to what was previously possible with chips alone.

Also for the three-dimensional structures formed by dice, the misalignment between two or more dice may entail the impossibility of packaging correctly the three-dimensional structures, in addition to the reduction in the possibility of carrying out communications between the dice, which are uncoupled on account of the misalignment.

In order to detect the presence of a misalignment, techniques are available that envisage the use of markers, which are set on the chips/dice. Appropriate optical detectors determine the positions of the optical markers; subsequently, the positions determined are processed in such a way as to verify the alignment of the chips/dice.

The techniques based upon the use of markers enable verification of the alignment of the chips/dice with high precision; however, they are particularly costly and complex given that they require the use of optical detectors.

Furthermore, different techniques exist, which envisage coupling, by means of appropriate capacitors, the chips, alignment of which is to be verified, and detecting the presence of possible misalignments on the basis of signals transmitted and received on the electrodes of these capacitors, as described, for example, in the U.S. Patent Publication No. US2002/0191835, or else in the U.S. Patent Publication No. US2007/0067115. These techniques are, however, subject to the limits intrinsically associated to determination of the values of capacitance of the capacitors; hence, they do not enable detection of misalignments in a particularly precise way.

BRIEF SUMMARY

An embodiment provides a method for verifying the alignment of integrated electronic devices that will enable the drawbacks of the known art to be at least partially overcome.

According to an embodiment, a method for verifying the alignment of a first integrated electronic device and a second integrated electronic device is provided.

In an embodiment, a method for verifying the alignment between a first integrated electronic device and a second integrated electronic device comprises the steps of: coupling said first and second integrated electronic devices by means of a reference capacitor and a first coupling capacitor; transmitting a transmission reference signal on a transmission reference electrode of said reference capacitor; receiving a coupling signal on a reception reference electrode of said reference capacitor; amplifying said coupling signal, generating a reception reference signal; generating a reception control signal as a function of said reception reference signal; transmitting a first communication signal on a first transmission electrode of said first coupling capacitor; receiving a first reception signal on a first reception electrode of said first coupling capacitor; amplifying said first reception signal, generating a first compensated signal; controlling a level of amplification in said steps of amplifying said coupling signal and of amplifying said first reception signal as a function of said reception control signal; and comparing an amplitude of said first communication signal and an amplitude of said first compensated signal, and detecting the presence of a possible misalignment between said first and second integrated electronic devices on the basis of the result of the step of comparing. In an embodiment, the method further comprises the steps of: establishing an expected relation between said first communication signal and said first compensated signal; and determining an effective relation between the amplitude of said first communication signal and the amplitude of said first compensated signal; and wherein said step of comparing comprises comparing said effective relation and said expected relation. In an embodiment, the method further comprises the step of generating a reception reference voltage, and wherein said step of generating a reception control signal comprises determining a difference between an amplitude of said reception reference signal and said reception reference voltage. In an embodiment, the method further comprises the steps of: receiving a calibration signal; amplifying said calibration signal, generating a transmission reference signal; generating a transmission control signal as a function of said transmission reference signal; and controlling a level of amplification in said step of amplifying said calibration signal as a function of said transmission control signal. In an embodiment, the method further comprises the step of generating a transmission reference voltage, wherein said step of generating a transmission control signal comprises determining a difference between an amplitude of said transmission reference signal and said transmission reference voltage. In an embodiment, said transmission reference voltage and said reception reference voltage are the same as one another. In an embodiment, said steps of generating a transmission reference voltage and a reception reference voltage comprise using voltage generators of a bandgap type. In an embodiment, wherein said step of determining a difference between an amplitude of said reception reference signal and said reception reference voltage comprises: generating a first current proportional to the amplitude of said reception reference signal; generating a second current proportional to said reception reference voltage; and integrating in time a current difference proportional to the difference of said first and second currents. In an embodiment, the method further comprises the step of providing said transmission reference electrode and said first transmission electrode on said first integrated electronic device, and the step of providing said reception reference electrode and said first reception electrode on said second integrated electronic device. In an embodiment, said step of providing said transmission reference electrode and said first transmission electrode comprises forming said transmission reference electrode and said first transmission electrode in such a way that they have one and the same first geometrical shape, and wherein said step of providing said reception reference electrode and said first reception electrode comprises forming said reception reference electrode and said first reception electrode in such a way that they have one and the same second geometrical shape. In an embodiment, wherein said coupling step comprises providing at least one second coupling capacitor having a second transmission electrode and a second reception electrode, set, respectively, on said first and second integrated electronic devices. In an embodiment, the method further comprises the steps of: transmitting on said second transmission electrode a second communication signal; receiving on said second reception electrode a corresponding second reception signal; amplifying said second reception signal, generating a second compensated signal; controlling a level of amplification in said step of amplifying said second reception signal as a function of said reception control signal; and comparing an amplitude of said second communication signal with an amplitude of said second compensated signal, said step of detecting the presence of a possible misalignment being moreover a function of said step of comparing an amplitude of said second communication signal with an amplitude of said second compensated signal. In an embodiment, said coupling step further comprises providing a third coupling capacitor and a fourth coupling capacitor, said third coupling capacitor having a third transmission electrode and a third reception electrode, set, respectively, on said first integrated electronic device and said second integrated electronic device, said fourth coupling capacitor having a fourth transmission electrode and a fourth reception electrode, set, respectively, on said first and second integrated electronic devices; and wherein said first, second, third, and fourth transmission electrodes surround said transmission reference electrode, are at the same distance from said transmission reference electrode, and have one and the same third geometrical shape; and wherein said first, second, third, and fourth reception electrodes surround said reception reference electrode, are at the same distance from said reception reference electrode, and have one and the same fourth geometrical shape. In an embodiment, wherein said transmission reference electrode and said reception reference electrode have one and the same fifth geometrical shape and are set in such a way that, when said first and second integrated electronic devices are aligned, they are completely superimposed; and wherein said first, second, third, and fourth transmission electrodes and said first, second, third, and fourth reception electrodes are set in such a way that, when said first and second integrated electronic devices are aligned, said first, second, third, and fourth transmission electrodes are partially superimposed, respectively, on said first, second, third, and fourth reception electrodes. In an embodiment, the method further comprises the steps of: transmitting on said second, third, and fourth transmission electrodes, respectively, a second communication signal, a third communication signal, and a fourth communication signal; receiving on said second, third, and fourth reception electrodes, respectively, a second reception signal, a third reception signal, and a fourth reception signal; amplifying said second, third, and fourth reception signals, generating, respectively, a second compensated signal, a third compensated signal, and a fourth compensated signal; controlling levels of amplification in said steps of amplifying said second, third, and fourth reception signal as a function of said reception control signal; and comparing the amplitudes of said second, third, and fourth compensated signals, respectively, with the amplitudes of the second, third, and fourth communication signals, said step of detecting the presence of a possible misalignment being moreover a function of said step of comparing the amplitudes of said second, third, and fourth compensated signals.

In an embodiment, a method, comprises: communicatively coupling first and second integrated electronic devices together through a reference capacitor and a first coupling capacitor; transmitting a transmission reference signal on a transmission reference electrode of said reference capacitor; receiving a coupling signal on a reception reference electrode of said reference capacitor; amplifying said coupling signal, generating a reception reference signal; generating a reception control signal as a function of said reception reference signal; transmitting a first communication signal on a first transmission electrode of said first coupling capacitor; receiving a first reception signal on a first reception electrode of said first coupling capacitor; amplifying said first reception signal, generating a first compensated signal; controlling a level of amplification in said steps of amplifying said coupling signal and of amplifying said first reception signal as a function of said reception control signal; and detecting a possible misalignment between said first and second integrated electronic devices based on an amplitude of said first communication signal and an amplitude of said first compensated signal. In an embodiment, the method further comprises the steps of: establishing an expected relation between said first communication signal and said first compensated signal; and determining an effective relation between the amplitude of said first communication signal and the amplitude of said first compensated signal, wherein said step of detecting comprises comparing said effective relation and said expected relation. In an embodiment, the method further comprises the step of generating a reception reference voltage, wherein said step of generating a reception control signal comprises determining a difference between an amplitude of said reception reference signal and said reception reference voltage. In an embodiment, the method further comprises the steps of: receiving a calibration signal; amplifying said calibration signal, generating the transmission reference signal; generating a transmission control signal as a function of said transmission reference signal; and controlling a level of amplification in said step of amplifying said calibration signal as a function of said transmission control signal. In an embodiment, the method further comprises: generating a transmission reference voltage, wherein said step of generating a transmission control signal comprises determining a difference between an amplitude of said transmission reference signal and said transmission reference voltage. In an embodiment, said transmission reference voltage and said reception reference voltage have a same voltage level. In an embodiment, said steps of generating a transmission reference voltage and generating a reception reference voltage comprise using voltage generators of a bandgap type. In an embodiment, said step of determining a difference between an amplitude of said reception reference signal and said reception reference voltage comprises: generating a first current proportional to the amplitude of said reception reference signal; generating a second current proportional to said reception reference voltage; and integrating in time a current difference proportional to the difference of said first and second currents. In an embodiment, the method further comprises: providing said transmission reference electrode and said first transmission electrode on said first integrated electronic device; and providing said reception reference electrode and said first reception electrode on said second integrated electronic device. In an embodiment, said step of providing said transmission reference electrode and said first transmission electrode comprises forming said transmission reference electrode and said first transmission electrode of a first geometrical shape, and wherein said step of providing said reception reference electrode and said first reception electrode comprises forming said reception reference electrode and said first reception electrode of a second geometrical shape. In an embodiment, said coupling step comprises providing at least one second coupling capacitor having a second transmission electrode and a second reception electrode, set, respectively, on said first and second integrated electronic devices. In an embodiment, the method further comprises the steps of: transmitting on said second transmission electrode a second communication signal; receiving on said second reception electrode a corresponding second reception signal; amplifying said second reception signal, generating a second compensated signal; and controlling a level of amplification in said step of amplifying said second reception signal as a function of said reception control signal wherein said step of detecting a possible misalignment is based on an amplitude of said second communication signal and an amplitude of said second compensated signal. In an embodiment, said coupling step further comprises providing a third coupling capacitor and a fourth coupling capacitor, said third coupling capacitor having a third transmission electrode and a third reception electrode, set, respectively, on said first integrated electronic device and said second integrated electronic device, said fourth coupling capacitor having a fourth transmission electrode and a fourth reception electrode, set, respectively, on said first and second integrated electronic devices; and wherein said first, second, third, and fourth transmission electrodes surround said transmission reference electrode, are at a same distance from said transmission reference electrode, and have a first geometrical shape; and wherein said first, second, third, and fourth reception electrodes surround said reception reference electrode, are at a same distance from said reception reference electrode, and have a second geometrical shape. In an embodiment, said transmission reference electrode and said reception reference electrode have a third geometrical shape and are set in such a way that, when said first and second integrated electronic devices are aligned, they are completely superimposed; and wherein said first, second, third, and fourth transmission electrodes and said first, second, third, and fourth reception electrodes are set in such a way that, when said first and second integrated electronic devices are aligned, said first, second, third, and fourth transmission electrodes are partially superimposed, respectively, on said first, second, third, and fourth reception electrodes. In an embodiment, the method further comprises: transmitting on said second, third, and fourth transmission electrodes, respectively, a second communication signal, a third communication signal, and a fourth communication signal; receiving on said second, third, and fourth reception electrodes, respectively, a second reception signal, a third reception signal, and a fourth reception signal; amplifying said second, third, and fourth reception signals, generating, respectively, a second compensated signal, a third compensated signal, and a fourth compensated signal; and controlling levels of amplification in said steps of amplifying said second, third, and fourth reception signal as a function of said reception control signal, wherein the detecting is based on amplitudes of the second, third and fourth compensated signals and amplitudes of the second, third and fourth communication signals. In an embodiment, the detecting comprises comparing the amplitudes of said first, second, third, and fourth compensated signals, respectively, with the amplitudes of the first, second, third, and fourth communication signals.

In an embodiment, a device comprises: a first integrated circuit, including: a transmission electrode of a first coupling capacitor; a first transmitter to transmit a time-variant first communication signal communicatively coupled to the transmission electrode of the first coupling capacitor; a reference transmission electrode of a reference capacitor, configured to transmit a time-variant transmission reference signal; and a second integrated circuit configured to couple to the first integrated circuit and including: a reception electrode of the first coupling capacitor; a first coupling variable-gain amplifier having a first input communicatively coupled to the reception electrode of the first coupling capacitor and configured to generate a first compensated signal; a reception electrode of the reference capacitor; a reference variable-gain amplifier having a first input communicatively coupled to the reception electrode of the reference capacitor; and a reception gain control block coupled to an output of the reference variable-gain amplifier and configured to generate at least one gain control signal to control a gain of the first coupling variable-gain amplifier and a gain of the reference variable-gain amplifier based on the output of the reference variable-gain amplifier, wherein an amplitude of the first communication signal and an amplitude of the first compensated signal have an expected relationship when the first and second integrated circuits are aligned. In an embodiment, the device further comprises: an alignment detector configured to couple to the first transmitter and the output of the first coupling variable-gain amplifier and to determine whether a relationship of the amplitude of the first communication signal and the amplitude of the first compensated signal is consistent with alignment of the first and second integrated circuits. In an embodiment, the alignment detector is on the first integrated circuit. In an embodiment, the reception gain control block comprises: a bandgap block configured to generate a reception reference voltage; and a comparator configured to determine a difference between an amplitude of the output of the second variable-gain amplifier and the reception reference voltage. In an embodiment, the first integrated circuit comprises: a transmission calibration variable-gain amplifier having a calibration signal input configured to receive a calibration signal, a control input configured to receive a gain control signal and an output communicatively coupled to the reference transmission electrode; a comparator block coupled between the output of the transmission calibration variable-gain amplifier and the control input of the variable gain amplifier to form a feed-back loop; and a bandgap block coupled to the comparator block and configured to provide a substantially constant reference voltage. In an embodiment, the reference transmission electrode and the transmission electrode of the first coupling capacitor have a first geometrical shape, and the reception electrode of the reference capacitor and the reception electrode of the first coupling capacitor have a second geometrical shape. In an embodiment, the device further comprises a second coupling capacitor having a transmission electrode on the first integrated circuit and a reception electrode on the second integrated circuit, the first integrated circuit further comprising a second transmitter configured to transmit a second communication signal and the second integrated circuit further comprising a second coupling variable-gain amplifier configured to generate a second compensated signal, wherein the reception gain control block is configured to control a gain of the second coupling variable-gain amplifier based on the output of the reference variable-gain amplifier, and an amplitude of the second communication signal and an amplitude of the second compensated signal have an expected relationship when the first and second integrated circuits are aligned.

In an embodiment, a device comprises: a first integrated circuit, including: a plurality of transmission electrodes of a corresponding plurality of coupling capacitors, the plurality of transmission electrodes configured to transmit respective time-variant communication signals; and a reference transmission electrode of a reference capacitor, configured to transmit a time-variant transmission reference signal; and a second integrated circuit configured to couple to the first integrated circuit and including: a plurality of reception electrodes of the plurality of coupling capacitors; a plurality of coupling amplifiers communicatively coupled to respective reception electrodes of the plurality of coupling capacitors and configured to generate a plurality of compensated signals; a reference reception electrode of the reference capacitor; a reference amplifier having a first input communicatively coupled to the reference reception electrode of the reference capacitor; and a reception gain control block configured to generate at least one gain control signal to control respective gains of the coupling amplifiers and of the reference amplifier based on an output of the reference amplifier, wherein amplitudes of the respective communication signals and corresponding compensated signals have corresponding expected relationships when the first and second integrated circuits are aligned. In an embodiment, the plurality of transmission electrodes surround the reference transmission electrode, have a first shape and are each a first distance from the reference transmission electrode; and the plurality of reception electrodes surround the reference reception electrode, have a second shape and are each a second distance from said reference reception. In an embodiment, the reference transmission electrode and the reference reception electrode have a third shape and, when the first and second integrated circuits are aligned, the reference transmission electrode and the reference reception electrode are superimposed and the respective transmission electrodes and reception electrodes of the plurality of coupling capacitors and partially superimposed. In an embodiment, the device further comprises: an alignment detector configured to determine whether the first and second integrated circuits are aligned based on the amplitudes of the respective communication signals and corresponding compensated signals.

In an embodiment, a system comprises: a first integrated circuit, including: means for generating a time-variant first communication signal; means for transmitting the time-variant first communication signal; means for generating a time-variant reference transmission signal; means for transmitting the time-variant reference transmission signal; a second integrated circuit configured to couple to the first integrated circuit and including: means for receiving the transmitted time-variant first communication signal; means for generating a first compensated signal from the received first communication signal; means for receiving the transmitted reference transmission signal; means for generating a reception reference signal based on the received reference transmission signal; and means for controlling a gain of the means for generating a first compensated signal and of the means for generating a reception reference signal based on the reception reference signal; and means for determining whether the first and second integrated circuits are aligned based on amplitudes of the first communication signal and of the first compensated signal. In an embodiment, the means for determining is on the first integrated circuit.

In an embodiment, a non-transitory computer-readable medium's contents cause at least one electronic device to perform a method, the method comprising: transmitting a transmission reference signal on a transmission reference electrode of a reference capacitor; receiving a coupling signal on a reception reference electrode of said reference capacitor; amplifying said coupling signal, generating a reception reference signal; generating a reception control signal as a function of said reception reference signal; transmitting a first communication signal on a first transmission electrode of a first coupling capacitor; receiving a first reception signal on a first reception electrode of said first coupling capacitor; amplifying said first reception signal, generating a first compensated signal; controlling a level of amplification of amplifying said coupling signal and of amplifying said first reception signal as a function of said reception control signal; and detecting a possible misalignment between first and second integrated electronic devices based on an amplitude of said first communication signal and an amplitude of said first compensated signal. In an embodiment, the method further comprises: establishing an expected relation between said first communication signal and said first compensated signal; and determining an effective relation between the amplitude of said first communication signal and the amplitude of said first compensated signal, wherein said step of detecting comprises comparing said effective relation and said expected relation. In an embodiment, the method further comprises: generating a reception reference voltage, and wherein said step of generating a reception control signal comprises determining a difference between an amplitude of said reception reference signal and said reception reference voltage. In an embodiment, the method further comprises: receiving a calibration signal; amplifying said calibration signal, generating the transmission reference signal; generating a transmission control signal as a function of said transmission reference signal; and controlling a level of amplification in said step of amplifying said calibration signal as a function of said transmission control signal. In an embodiment, the method further comprises: generating a transmission reference voltage, wherein said step of generating a transmission control signal comprises determining a difference between an amplitude of said transmission reference signal and said transmission reference voltage.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, operational amplifiers, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The figures are not necessarily reflective of relative proportions and positioning of the structures shown therein.

The headings provided herein are for convenience only and do not interpret the scope or meaning of the embodiments.

Figure 2:
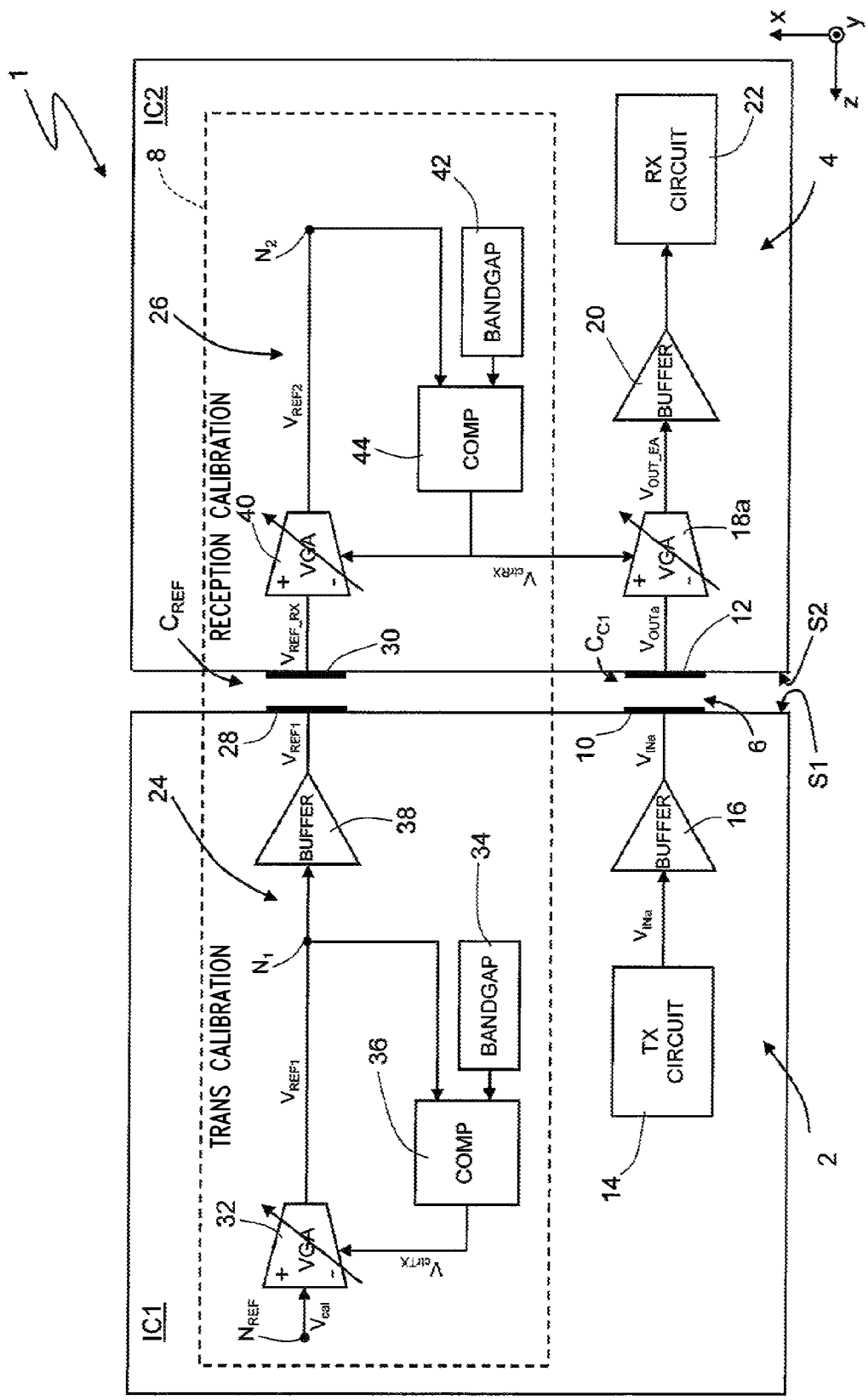
FIG. 2 shows a circuit diagram of an electronic capacitive-coupling communication circuit.

By way of example and without this implying any loss of generality, in what follows embodiments of the present disclosure are described with reference to the case where the integrated electronic devices of which it is desired to verify the alignment are chips, in particular a first chip IC1 and a second chip IC2. As shown in FIG. 2, the first and second chips IC1, IC2 define, respectively, a first top surface S1 and a second top surface S2, and are set in the so-called face-to-face mode, in such a way that the first and second top surfaces S1, S2 face one another. For instance, assuming that the first and second chips IC1, IC2 are formed by respective bodies of semiconductor material (not shown), the first and second top surfaces S1, S2 can be defined, respectively, by the bodies of semiconductor material of the first and second chips IC1, IC2. Alternatively, the first and second top surfaces S1, S2 can be defined by respective top regions (not shown) of the first and second integrated circuits IC1, IC2, arranged on the respective bodies of semiconductor material, and comprising, for example, metallizations and/or dielectric layers.

As described in greater detail hereinafter, the present disclosure envisages resorting to an electronic capacitive-coupling communication circuit, an embodiment of which, for reasons of brevity, will be referred to hereinafter as "communication circuit 1".

As shown in FIG. 2, the communication circuit 1 comprises: a first transmitter stage 2, formed in the first chip IC1; a first receiver stage 4, formed in the second chip IC2; and at least one first communications channel 6, which comprises a first coupling capacitor $C_{C1}$ and connects the first transmitter stage 2 and the first receiver stage 4. In addition, the communication circuit 1 comprises a reference channel 8, distributed between the first and second chips IC1, IC2, and described in greater detail hereinafter.

The first coupling capacitor $C_{C1}$ is formed by a first transmission electrode 10 and by a first reception electrode 12, which extend, respectively, on the first and second top surfaces S1, S2.

The first transmitter stage 2 comprises a transmitter circuit 14 and a first transmission buffer 16, which has an input connected to the transmitter circuit 14, and an output connected to the first transmission electrode 10.

In greater detail, the first transmission buffer 16 is a unit-gain amplifier circuit, and can be formed by a respective operational amplifier (not shown), the output terminal of which defines the output of the first transmission buffer 16 and is short-circuited to the negative input terminal of the operational amplifier. The output terminal is moreover connected to the first transmission electrode 10, whilst the positive input terminal of the operational amplifier is connected to the transmitter circuit 14.

In what follows, with regard to the example embodiments of buffers that will be mentioned and described, for reasons of simplicity, referred to as "input" and "output" are, respectively, the positive input terminal and the output terminal of the corresponding operational amplifiers, except where otherwise specified, assuming that these buffers are the same, from a circuit standpoint, as the first transmission buffer 16, and implying the short-circuit connection between the output terminals and the negative input terminals of the corresponding operational amplifiers.

Once again with reference to FIG. 2, the first receiver stage 4 comprises a first compensation amplifier 18a of a variable-gain analog type, a first reception buffer 20, and a receiver circuit 22. In particular, the first compensation amplifier 18a has, in addition to a control terminal described hereinafter, an input connected to the first reception electrode 12 and an output connected to the input of the first reception buffer 20. The output of the first reception buffer 20 is hence connected to the receiver circuit 22.

Both the first transmission buffer 16 and the first reception buffer 20 are such as to be able to drive the loads present on the respective outputs, in the case in point the first transmission electrode 10 and the receiver circuit 22. Consequently, when the transmitter circuit 14 generates a first communication signal $V_{INa}$ of an analog type and of a known amplitude, it is brought back onto the first transmission electrode 10, with consequent generation, on the first reception electrode 12, of a corresponding first received signal $V_{OUTa}$.

On account of the inevitable presence of parasitic capacitors connected to the first transmission electrode 10 and to the first reception electrode 12, even assuming that the first transmission buffer 16 is ideal, the amplitude of the first received signal $V_{OUTa}$ is attenuated with respect to the amplitude of the first communication signal $V_{INa}$. In practice, the parasitic capacitors and the first coupling capacitor $C_{C1}$ form a capacitive divider that causes an attenuation of the first received signal $V_{OUTa}$ with respect to the first communication signal $V_{INa}$. To compensate this attenuation either totally or in part, it is possible to act on the first compensation amplifier 18a, by appropriately varying the gain thereof. For this purpose, the control terminal of the first compensation amplifier 18a is connected to the reference channel 8, as described hereinafter.

In detail, the embodiment of the reference channel 8 illustrated comprises: a transmission calibration stage 24, formed in the first chip IC1; a reception calibration stage 26, formed in the second chip IC2; and a reference capacitor $C_{REF}$, formed by a transmission reference electrode 28 and by a reception reference electrode 30, which extend, respectively, on the first and second top surfaces S1, S2.

In detail, it is possible to obtain the reference capacitor $C_{REF}$ and the first coupling capacitor $C_{C1}$ in such a way that, when the first and second chips IC1, IC2 are aligned, they are the same as one another, and hence have one and the same capacitance. In particular, it is possible to form and set the transmission reference electrode 28 and the reception reference electrode 30 in such a way that they have the same shapes, respectively, as the first transmission electrode 10 and the first reception electrode 12. In addition, it is possible to obtain the transmission reference electrode 28 and the reception reference electrode 30 in such a way that, when the first and second chips IC1, IC2 are aligned, their mutual arrangement is the same as the mutual arrangement of the first transmission electrode 10 and of the first reception electrode 12. In this way, the reference capacitor $C_{REF}$ and the first coupling capacitor $C_{C1}$ introduce one and the same attenuation.

The transmission calibration stage 24 comprises a first reference amplifier 32, a first reference circuit 34, a first comparator stage 36, and a first reference buffer 38, which can be the same as the aforesaid first transmission buffer 16 and first reception buffer 20.

In detail, the first reference amplifier 32 is of a variable-gain analog type, and has an input, an output, and a control terminal. In particular, the input of the first reference amplifier 32 defines a first calibration node $N_{REF}$, whilst the output of the first reference amplifier 32 defines a first first-feedback node $N_1$, and is connected to the input of the first reference buffer 38, the output of which is connected to the transmission reference electrode 28. In addition, the output of the first reference amplifier 32 is connected to the first comparator stage 36; in particular, the first comparator stage 36 has an output and a first input and a second input, the output of the first reference amplifier 32 being connected to the first input of the first comparator stage 36. The second input of the first comparator stage 36 is connected to the first reference circuit 34, whilst the output of the first comparator stage 36 is connected to the control terminal of the first reference amplifier 32, in such a way that the first reference amplifier 32 and the first comparator stage 36 define a first feedback loop.

The reception calibration stage 26 comprises a second reference amplifier 40, a second reference circuit 42, and a second comparator stage 44. In what follows it is assumed, for reasons of simplicity, that the first calibration amplifier 18a and the second reference amplifier 40 are the same as one another, even though a person skilled in the art will be able to implement the present method even in the case where the first calibration amplifier 18a and the second reference amplifier 40 are different. Possibly, also the first reference amplifier 32 can be the same as the first calibration amplifier 18a and as the second reference amplifier 40.

In detail, from the circuit standpoint, the second comparator stage 44 is the same as the first comparator stage 36, and hence has an output and a first input and a second input. In addition, the second reference amplifier 40 is of a variable-gain analog type, and has an input, an output, and a control terminal. The input of the second reference amplifier 40 is connected to the reception reference electrode 30, whilst the output of the second reference amplifier 40 defines a first second-feedback node $N_2$, and is connected to the first input of the second comparator stage 44. The second input of the second comparator stage 44 is connected to the second reference circuit 42, whilst the output of the second comparator stage 44 is connected to the control terminal of the second reference amplifier 40 in such a way that the second reference amplifier 40 and the second comparator stage 44 define a second feedback loop. In addition, the output of the second comparator stage 44 is connected to the control terminal of the first compensation amplifier 18a.

In greater detail, the first and second reference circuits 34, 42 supply, respectively, a first reference voltage $V_{BG1}$ and a second reference voltage $V_{BG2}$, both of a D.C. type. In particular, both the first reference circuit 34 and second reference circuit 42 may be formed by a respective bandgap voltage reference, commonly known as "bandgap circuit".

Bandgap circuits are used for generating reference voltages within integrated circuits in which the bandgap circuits themselves are integrated. In particular, given a generic bandgap formed within a substrate of semiconductor material, this bandgap circuit is able to supply a respective reference voltage that is very close to the bandgap voltage that characterizes this semiconductor material, or in any case depends, to a first approximation, only upon this bandgap voltage. In other words, to a first approximation, the reference voltage is a function of the semiconductor material in which the bandgap circuit is obtained and does not depend upon other factors, such as, for example, the temperature, or else upon the technological processes that have led to formation of the integrated circuit in which the bandgap circuit itself is present. Consequently, the reference voltages supplied by bandgap circuits are substantially immune from factors such as, for example, process non-uniformities, differences in technology (for example, 1V CMOS technology, or else 3.3V CMOS technology, BiCMOS) and temperature. Purely by way of example, in the case where the semiconductor material is silicon, various types of bandgap circuits are available, capable of supplying reference voltages very close to 1.2 V.

Figure 3:
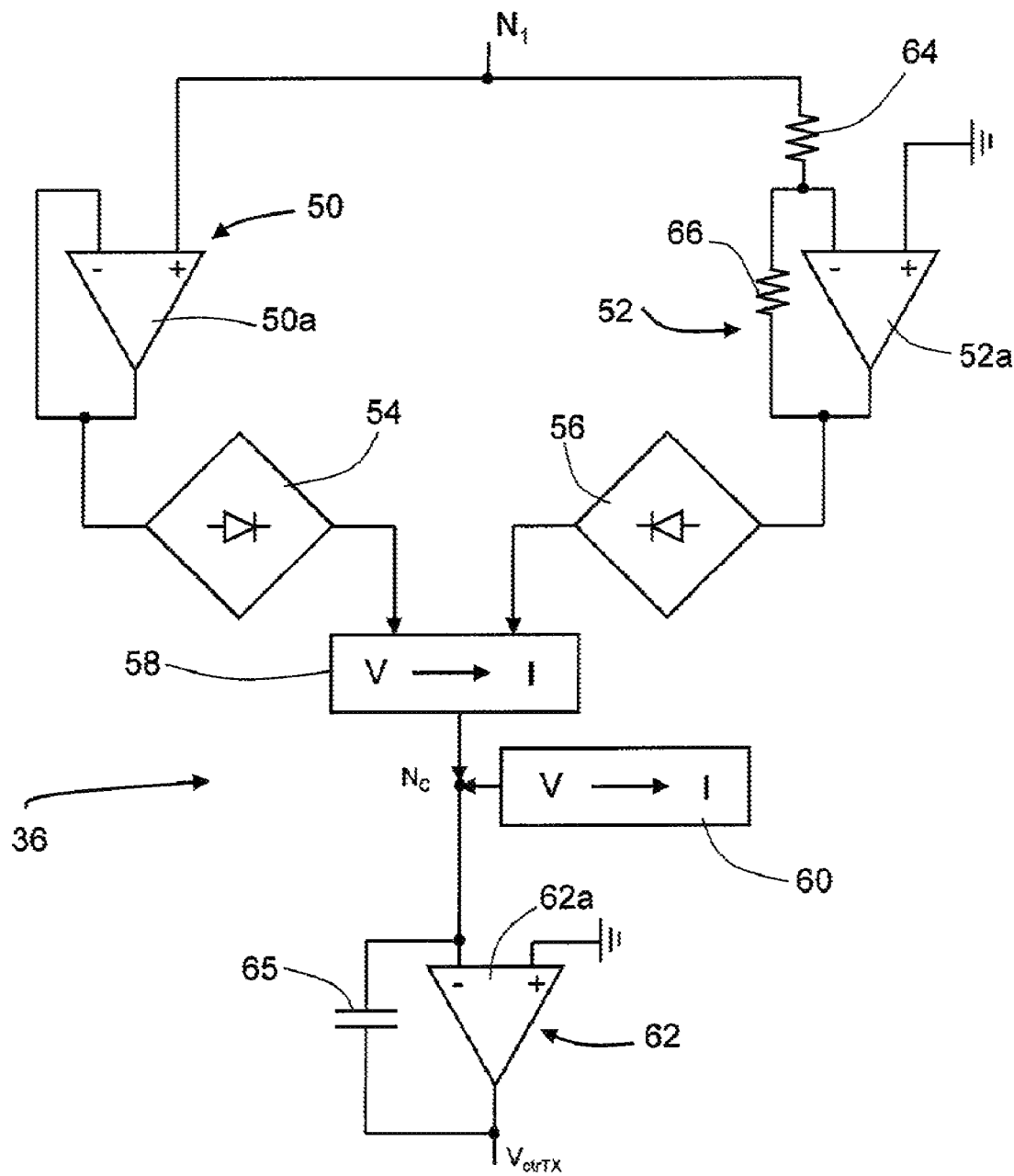
FIG. 3 shows a circuit diagram of a comparator stage.

FIG. 3 shows in greater detail an embodiment of the first comparator stage 36, which is connected to the first first-feedback node $N_1$. In particular, in the embodiment illustrated in this figure, the first comparator stage 36 comprises a first comparison buffer 50 and a second comparison buffer 52, a first rectifier 54 and a second rectifier 56 both of a single half-wave type, a first voltage-to-current converter 58 and a second voltage-to-current converter 60, and an integrator 62.

In greater detail, the first and second comparison buffers 50, 52 are formed by respective operational amplifiers, designated by 50a and 52a. The first first-feedback node $N_1$ is connected to the input of the first comparison buffer 50, i.e., to the positive input terminal of the operational amplifier 50a of the first comparison buffer 50. In addition, the first first-feedback node $N_1$ is connected to the negative input terminal of the operational amplifier 52a of the second comparison buffer 52, possibly by interposition of a buffer resistor 64 connected in series between the first first-feedback node $N_1$ and the negative input terminal of the operational amplifier 52a of the second comparison buffer 52, the positive input terminal of which is connected to ground.

In addition, connected between the negative input terminal and the output terminal of the operational amplifier 52a of the second comparison buffer 52 is a feedback resistor 66; as illustrated, the second comparison buffer 52 is an inverting buffer.

The first and second rectifiers 54, 56 have respective inputs, connected, respectively, to the output of the first comparison buffer 50 and to the output of the second comparison buffer 52, and hence to the output terminals of the operational amplifiers 50a, 52a of the first and second comparison buffers 52. In addition, both the first rectifier 54 and the second rectifier 56 have a respective output.

The first voltage-to-current converter 58 has one output and two input terminals, the latter being connected, respectively, to the output of the first rectifier 54 and to the output of the second rectifier 56. Operatively, when a load is present on the output of the first voltage-to-current converter 58, the load is traversed by a current that does not depend upon the load itself, but rather just upon the voltage present between the inputs of the first voltage-to-current converter 58.

The second voltage-to-current converter 60 can be the same as the first voltage-to-current converter 58, and hence it also has one output and two input terminals (not shown). In particular, the two input terminals of the second voltage-to-current converter 60 define the aforementioned second input of the first comparator stage 36 and are connected (connection not shown) to the first reference circuit 34 in such a way that present across them is the first reference voltage $V_{BG1}$. Instead, the output of the second voltage-to-current converter 60 is connected to the output of the first voltage-to-current converter 58, and defines a comparison node $N_C$.

The integrator 62 is formed by a respective operational amplifier 62a and by an integration capacitor 65. In particular, the negative input terminal of the operational amplifier 62a is connected to the comparison node $N_C$. In addition, the negative input terminal of the operational amplifier 62a is connected, through the integration capacitor 65, to the output terminal of the operational amplifier 62a itself, which is in turn connected to the control terminal of the first reference amplifier 32 (connection not shown). In addition, the positive input terminal of the operational amplifier 62a is connected to ground.

The currents generated by the first and second voltage-to-current converters 58, 60 converge in the comparison node $N_C$, these currents having directions such that the integrator 62 integrates a current equal to the difference between the currents generated by the first and second voltage-to-current converters 58, 60. On the output of the integrator 62 there is hence generated a first control signal $V_{ctrTX}$, which is supplied to the control terminal of the first reference amplifier 32.

The second comparator stage 44 is similar to the first comparator stage 36, and supplies a second control signal $V_{ctrRX}$ on the control terminals of the second reference amplifier 40 and of the first compensation amplifier 18a.

Operatively, the behavior of the communication circuit 1 is now described assuming that the transmitter circuit 14 transmits a first communication signal $V_{INa}$ of a time-variable type and of known amplitude, as has been said. In addition, it is assumed that the first calibration node $N_{REF}$ receives a calibration signal $V_{cal}$ of a time-variable type, which can differ from the first communication signal $V_{INa}$. Alternatively, it is in any case possible to connect the first calibration node $N_{REF}$ to the transmitter circuit 14 in such a way that the calibration signal $V_{cal}$ is the same as the first communication signal $V_{INa}$.

In use, on the first transmission electrode 10 the first communication signal $V_{INa}$ is present; consequently, on the first reception electrode 12, and hence at input to the first compensation amplifier 18a, the first received signal $V_{OUTa}$ is present. Instead, at output from the first compensation amplifier 18a a $V_{OUT\_Ea}$ is present.

As regards, instead, the reference channel 8, present on the output of the first reference amplifier 32, and hence present on the first first-feedback node $N_1$, is a first reference signal $V_{REF1}$, which is likewise present on the transmission reference electrode 28. Given the capacitive coupling between the transmission reference electrode 28 and the reception reference electrode 30, at input to the second reference amplifier 40 a coupling signal $V_{REF\_RX}$ is set up. At output from the second reference amplifier 40, and hence on the first second-feedback node $N_2$, a second reference signal $V_{REF2}$ is, instead, present.

In greater detail, thanks to the first feedback loop, the first control signal $V_{ctrTX}$ controls the gain of the first reference amplifier 32 in such a way that the first reference signal $V_{REF1}$ (time-variable) has an amplitude independent of the amplitude of the calibration signal $V_{cal}$ and directly proportional to the first reference voltage $V_{BG1}$ generated by the first reference circuit 34; in other words, the following relation applies: $V_{REF1} = k_1 \cdot V_{BG1}$. In detail, in steady-state conditions, the first control signal $V_{ctrTX}$ assumes a constant value that depends upon the amplitude of the calibration signal $V_{cal}$ and upon the first reference voltage $V_{BG1}$.

Likewise, on account of the presence of a capacitive divider formed by the reference capacitor $C_{REF}$ and by inevitable parasitic capacitors connected to the reference capacitor $C_{REF}$, the coupling signal $V_{REF\_RX}$ has an amplitude smaller than the first reference signal $V_{REF1}$. However, thanks to the second feedback loop, the second control signal $V_{ctrRX}$ controls the gain of the second reference amplifier 40 in such a way that the second reference signal $V_{REF2}$, which is also time-variable, has an amplitude directly proportional to the second reference voltage $V_{BG2}$ generated by the second reference circuit 42, irrespective of the alignment or misalignment of the first and second chips IC1, IC2. In other words, the following relation applies: $V_{REF2} = k_2 \cdot V_{BG2}$. In detail, in steady-state conditions the second control signal $V_{ctrRX}$ assumes a constant value that depends upon the amplitude of the coupling signal $V_{REF\_RX}$ and upon the second reference voltage $V_{BG2}$.

Assuming that the first and second reference voltages $V_{BG1}$, $V_{BG2}$ are the same as one another, and that also the architectures of the first and second comparator stages 36, 44 are the same as one another (and hence $k_1 = k_2 = k$), the following relation applies $AV_{REF1} = k \cdot V_{BG1} = AV_{REF2} = k \cdot V_{BG2}$, where $AV_{REF1}$ and $AV_{REF2}$ are, respectively, the amplitudes of the first and second reference signals $V_{REF1}$, $V_{REF2}$. The second reference signal $V_{REF2}$ has the same amplitude and the same temporal evolution as the first reference signal $V_{REF1}$, which, amongst other things, has the same temporal evolution as the calibration signal $V_{cal}$. In other words, the second control signal $V_{ctrRX}$ determines the gain of the second reference amplifier 40 in such a way as to compensate for the attenuation introduced by the capacitive divider formed by the reference capacitor $C_{REF}$, irrespective of the alignment or misalignment of the first and second chips IC1, IC2.

If the first and second chips IC1, IC2 are effectively aligned with respect to one another, and in the case where the reference capacitor $C_{REF}$ and the first coupling capacitor $C_{C1}$ are such as to introduce, in conditions of alignment, one and the same attenuation, given that the second control signal $V_{ctrRX}$ controls also the gain of the first compensation amplifier 18a, the attenuation introduced by the capacitive divider associated to the first coupling capacitor $C_C$ is also compensated. Consequently, the first compensated signal $V_{OUT\_Ea}$ has, in addition to the same temporal evolution, also the same amplitude as the first communication signal $V_{INa}$. Likewise, also in the case where the first coupling capacitor $C_{C1}$ and the reference capacitor $C_{REF}$ are different from one another (even in conditions of alignment), it is in any case possible to establish a first relation of alignment (for example, a ratio) between the amplitudes of the first compensated signal $V_{OUT\_Ea}$ and of the first communication signal $V_{INa}$, which is valid in conditions of alignment and depends upon the ratio between the attenuations introduced by the first coupling capacitor $C_{C1}$ and by the reference capacitor $C_{REF}$.

In the case of misalignment, present between the amplitudes of the first compensated signal $V_{OUT\_Ea}$ and of the first communication signal $V_{INa}$ is a first effective relation, different from the aforementioned first relation of alignment, which depends in particular upon the characteristics (degree of a translation and of a possible rotation) of the misalignment. In fact, the control signal $V_{ctrRX}$ continues to control the gain of the second reference amplifier 40 in such a way as to compensate for the attenuation introduced by the capacitive divider formed by the reference capacitor $C_{REF}$; however, given that, on account of the misalignment, the attenuation introduced by the first coupling capacitor $C_{C1}$ is no longer equal to the attenuation introduced by the reference capacitor $C_{REF}$, hence the gain introduced by the first calibration amplifier 18a is under or oversized with respect to the attenuation introduced by the first coupling capacitor $C_{C1}$.

The present method hence envisages determination of the first relation of alignment, regarding the amplitudes of the first compensated signal $V_{OUT\_Ea}$ and of the first communication signal $V_{INa}$, and valid in conditions of alignment.

In this way, if it is desired to verify the possible alignment between the first and second chips IC1, IC2 at a generic instant T, it is possible to detect the amplitudes of the first compensated signal $V_{OUT\_Ea}$ and of the first communication signal $V_{INa}$ in this instant T, determining the corresponding first effective relation, and comparing the first effective relation with the first relation of alignment. In the case where the first effective relation departs, taking into account the inevitable tolerances, from the first relation of alignment, it is inferred that the first and second chips IC1, IC2 are not aligned.

Figure 1:
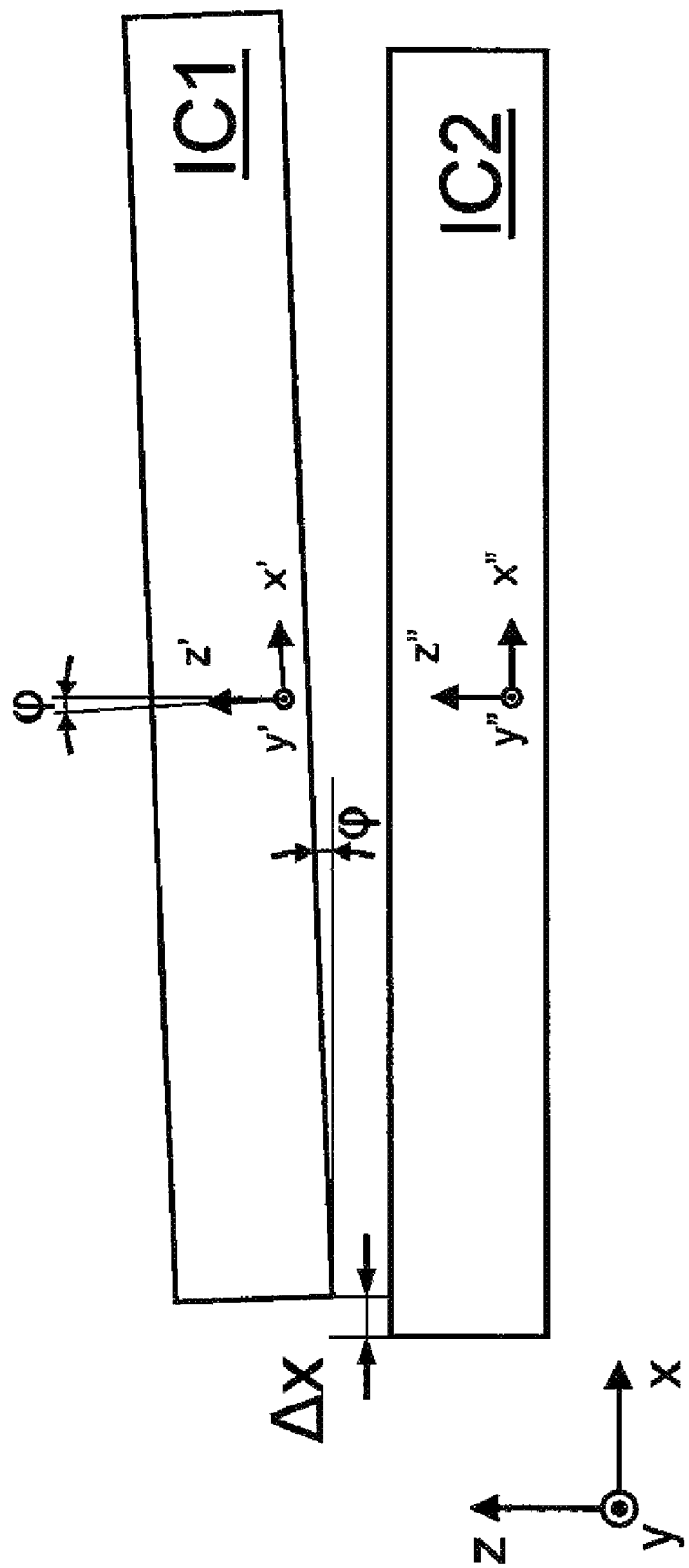
FIG. 1 shows a side view of two chips.

In particular, a possible rotation, for example, of the first chip IC1 with respect to the second chip IC2 (angle φ other than zero, with reference to FIG. 1), can be conveniently detected if the transmission reference electrode 28 and the reception reference electrode 30 are, respectively, the same as the first transmission electrode 10 and the first reception electrode 12. In this case, the rotation entails that the amplitude of the first compensated signal $V_{OUT\_Ea}$ differs from the amplitude of the first communication signal $V_{INa}$. Likewise, a possible translation along the axes x or y of the reference system x, y, z, for example, of the first chip IC1 with respect to the second chip IC2, can be appropriately detected using a first coupling capacitor $C_{C1}$ different from the reference capacitor $C_{REF}$.

In order to detect the amplitudes of the first compensated signal $V_{OUT\_Ea}$ and of the first communication signal $V_{INa}$, it is possible to contact with probes the transmitter circuit 14 and the receiver circuit 22, it being possible for these probes to be in turn connected to an external processor (see FIG. 7) that has the tasks of storing the first relation of alignment, determining the first effective relation, and comparing the first effective relation with the first relation of alignment. Alternatively, once again in order to detect the amplitudes of the first compensated signal $V_{OUT\_Ea}$ and of the first communication signal $V_{INa}$, it is possible to integrate a first peak-detector circuit and a second peak-detector circuit (not shown) in the first and second dice IC1, IC2, respectively, so that they are connected to the transmitter circuit 14 and to the receiver circuit 22, respectively.

In addition, it is possible to integrate, alternatively in the first chip IC1 or in the second IC2, a processing circuit (see FIG. 7), connected to the first peak-detector circuit and to the second peak-detector circuit and configured so as to store the first relation of alignment, determine the first effective relation, and comparing the first effective relation with the first relation of alignment.

Figure 4:
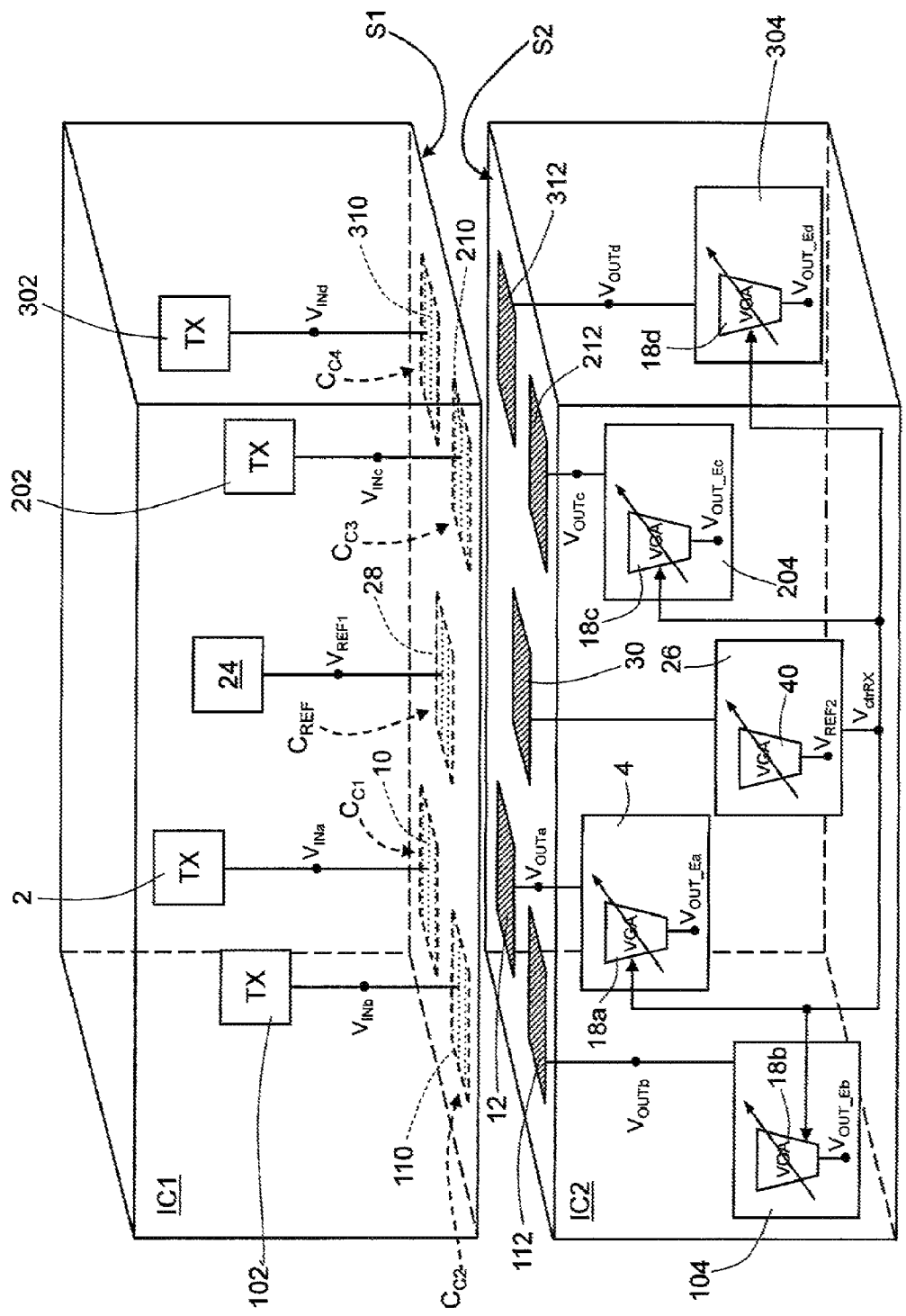
FIG. 4 is a schematic illustration of a perspective view of a first chip and of a second chip.

As illustrated by way of example in FIG. 4, the transmission reference electrode 28 and the reception reference electrode 30 can be set at the center, respectively, of the first and second top surfaces S1, S2 of the first and second chips IC1, IC2. In addition, the first transmission electrode 10 and the first reception electrode 12 can be set so as to be centered, respectively, in corresponding vertices of a first imaginary rectangle and a second imaginary rectangle having respective centers coinciding with the centers of the transmission reference electrode 28 and of the reception reference electrode 30.

In addition, there may for example be present a second transmitter stage IC2, a third transmitter stage 202, and a fourth transmitter stage 302, a second receiver stage 104, a third receiver stage 204, and a fourth receiver stage 304, and a second communications channel, a third communications channel, and a fourth communications channel, which comprise, respectively, a second coupling capacitor $C_{C2}$, a third coupling capacitor $C_{C3}$, and a fourth coupling capacitor $C_{C4}$, and connect, respectively, the second transmitter stage IC2 and the second receiver stage 104, the third transmitter stage 202 and the third receiver stage 204, and the fourth transmitter stage 302 and the fourth receiver stage 304.

In detail, the second, third, and fourth coupling capacitors $C_{C2}$, $C_{C3}$, $C_{C4}$ are formed, respectively, by a second transmission electrode 110 and a second reception electrode 112, by a third transmission electrode 210 and a third reception electrode 212, and by a fourth transmission electrode 310 and a fourth reception electrode 312.

The second, third, and fourth transmission electrodes 110, 210, 310 extend on the first top surface S1, for example, centered in the respective vertices of the first imaginary rectangle. Likewise, the second, third, and fourth reception electrodes 112, 212, 312 extend on the second top surface S2, for example, centered in the corresponding vertices of the second imaginary rectangle. As illustrated, the first, second, third, and fourth transmission electrodes 10, 110, 210, 310 surround the transmission reference electrode 28, whilst the first, second, third, and fourth reception electrodes 12, 112, 212, 312 surround the reception reference electrode 30.

The second, third, and fourth receiver stages 104, 204, 304 can be the same as the first receiver stage, and hence comprise, respectively, a second calibration amplifier 18b, a third calibration amplifier 18c, and a fourth calibration amplifier 18d, the control terminals of which are connected to the output of the second comparator stage 44 in such a way as to receive the second control signal $V_{ctrRX}$. In addition, transmitted on the second transmission electrode 110, the third transmission electrode 210, and the fourth transmission electrode 310 are, respectively, a second communication signal $V_{INb}$, a third communication signal $V_{INc}$, and a fourth communication signal $V_{INd}$, which are, for example, the same as the first communication signal $V_{INa}$, and hence on the second, third, and fourth reception electrodes 112, 212, 312 there set up, respectively, a second received signal $V_{OUTb}$, a third received signal $V_{OUTc}$, and a fourth received signal $V_{OUTd}$. Consequently, on the respective outputs, the second, third, and fourth calibration amplifiers 18b, 18c, 18d generate, respectively, a second compensated signal $V_{OUT\_Eb}$, a third compensated signal $V_{OUT\_Ec}$, and a fourth compensated signal, $V_{OUT\_Ed}$.

In greater detail, it is possible to obtain the second, third, and fourth coupling capacitors $C_{C2}$, $C_{C3}$, $C_{C4}$ in such a way that, when the first and second chips are aligned, they have the same capacitance as the first coupling capacitor $C_{C1}$. In addition, it is possible to obtain the second coupling capacitor $C_{C2}$, the third coupling capacitor $C_{C3}$, and the fourth coupling capacitor $C_{C4}$ in such a way that the second, third, and fourth transmission electrodes 110, 210, 310 have the same shape as the first transmission electrode 10 (possibly coinciding with the shape of the transmission reference electrode 28), and that the second, third, and fourth reception electrodes 112, 212, 312 have the same shape as the first reception electrode 12 (possibly coinciding with the shape of the reception reference electrode 30). In addition, the pairs of electrodes formed, respectively, by the second transmission electrode 110 and the second reception electrode 112, by the third transmission electrode 210 and the third reception electrode 212, as well as by the fourth transmission electrode 310 and the fourth reception electrode 312, can be formed in such a way that, in conditions of alignment, the mutual arrangement of the respective electrodes is the same as the mutual arrangement of the transmission reference electrode 28 and of the reception reference electrode 30. In this way, the second, third, and fourth coupling capacitors $C_{C2}$, $C_{C3}$, $C_{C4}$ introduce the same attenuation introduced by the reference capacitor $C_{REF}$.

Given that the second control signal $V_{ctrRX}$ controls also the gain of the second, third, and fourth compensation amplifiers 18b-18d, if the first and second chips IC1, IC2 are effectively aligned with respect to one another, and in the case where the reference capacitor $C_{REF}$ and the second, third, and fourth coupling capacitors $C_{C2}$, $C_{C3}$, $C_{C4}$ are effectively such as to introduce, in conditions of alignment, one and the same attenuation, also the attenuations introduced by the second, third, and fourth coupling capacitors $C_{C2}$, $C_{C3}$, $C_{C4}$ are compensated. Consequently, the second, third, and fourth compensated signals $V_{OUT\_Eb}$, $V_{OUT\_Ec}$, $V_{OUT\_Ed}$ have, in addition to the same time evolutions, also the same amplitudes as the second, third, and fourth communication signals $V_{INb}$, $V_{INc}$, $V_{INd}$.

Likewise, also in the case where the second, third, and fourth coupling capacitors $C_{C2}$, $C_{C3}$, $C_{C4}$ are different (even in conditions of alignment) from one another and/or from the reference capacitor $C_{REF}$, it is in any case possible to establish a second relation of alignment, a third relation of alignment, and a fourth relation of alignment that are valid in conditions of alignment and that correspond, respectively, to the second communication signal $V_{INb}$ and the second compensated signal $V_{OUT\_Eb}$, the third communication signal $V_{INc}$, and the third compensated signal $V_{OUT\_Ec}$, and the fourth communication signal $V_{INd}$, and the fourth compensated signal $V_{OUT\_E}$.

In the case of misalignment, instead of the aforementioned second, third, and fourth relations of alignment, there apply, respectively, a second effective relation, a third effective relation, and a fourth effective relation.

Consequently, by detecting (for example in a way similar to the one described with regard to the first communication signal $V_{INa}$ and to the first compensated signal $V_{OUT\_Ea}$) the amplitudes of the second, third, and fourth communication signals $V_{INb}$, $V_{INc}$, $V_{INd}$ and of the second, third, and fourth compensated signals $V_{OUT\_Eb}$, $V_{OUT\_Ec}$, $V_{OUT\_E}$, determining the aforementioned second, third, and fourth effective relations, and comparing them with the corresponding second, third, and fourth relations of alignment, it is possible to obtain further information on the possible misalignment of the first and second chips IC1, IC2. In addition, by arranging the first, second, third, and fourth coupling capacitors $C_{C1}$, $C_{C2}$, $C_{C3}$, $C_{C4}$ as far away as possible from the reference capacitor $C_{REF}$, compatibly with the dimensions of the first and second chips IC1, IC2, it is possible to detect misalignments, in particular rotations, of modest degree.

Figure 5A:
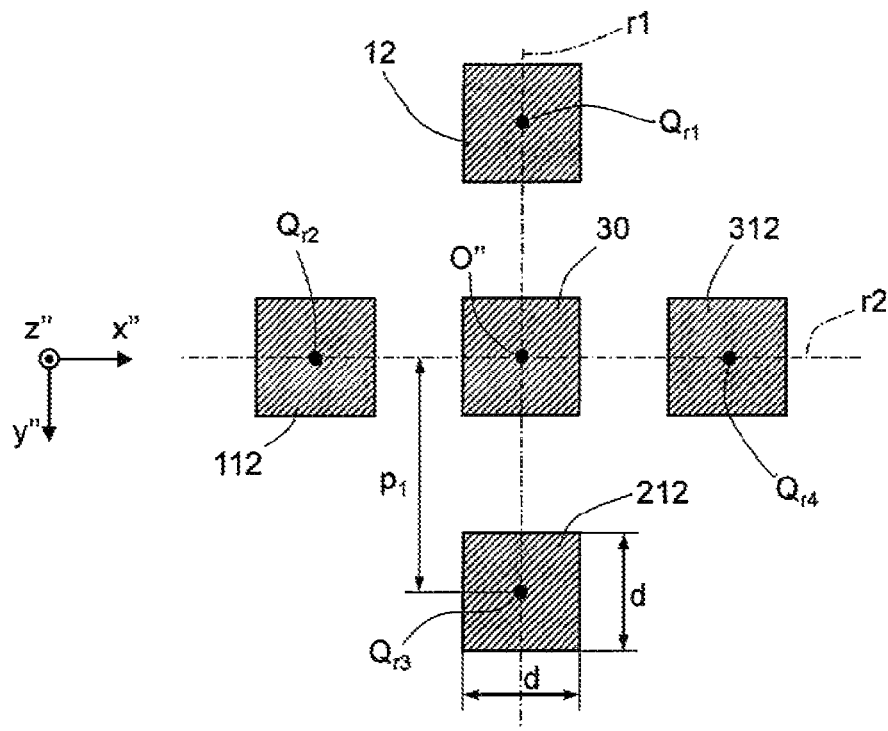
FIGS. 5a and 5b show in top plan view a first arrangement and a second arrangement of electrodes, respectively, on the second chip and on the first chip.
Figure 5B:
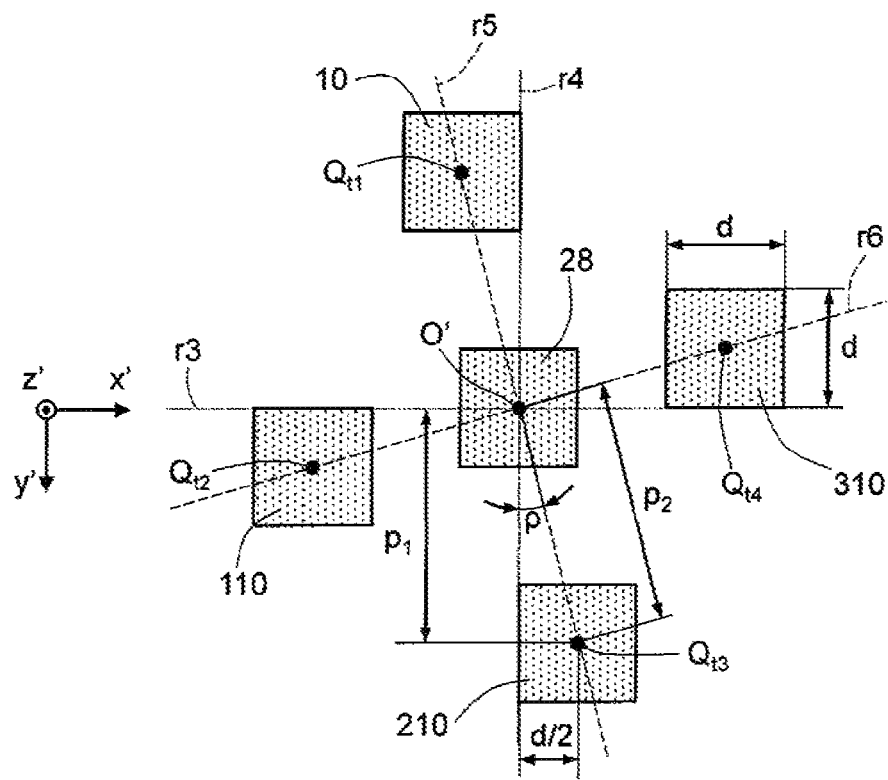

As shown by way of example in FIGS. 5a, 5b, it is in any case possible to arrange the first, second, third, and fourth coupling capacitors $C_{C1}$, $C_{C2}$, $C_{C3}$, $C_{C4}$, as well as the reference capacitor $C_{REF}$, in a way different from what has been described and shown previously. In particular, a different embodiment is described in what follows, assuming that the electrodes of the aforementioned capacitors have a negligible thickness.

In detail, as shown in FIG. 5a, the first, second, third, and fourth reception electrodes 12, 112, 212, 312 can all have the shape, for example, of a square with sides of length d and parallel alternatively to the axis x" and to the axis y", and be set on the second top surface S2 in such a way that the respective geometrical centers $Q_{r1}$, $Q_{r2}$, $Q_{r3}$, $Q_{r4}$ are at the same distance from a first central point O" of the second top surface S2, with distance, for example equal to $p_1$. In addition, the first two of these electrodes, for example the first reception electrode 12 and the third reception electrode 212, can be set along a first straight line r1 passing through the first central point O" and parallel to the axis y", whilst the other two of them, for example the second reception electrode 112 and the fourth reception electrode 312, can be set along a second straight line r2, passing through the first central point O" and parallel to the axis x". As illustrated, the first and third reception electrodes 12, 212, as likewise the second and fourth reception electrodes 112, 312, are set specular with respect to the first central point O". In addition, the first and third reception electrodes 12, 212 have geometrical centers $Q_{r1}$, $Q_{r3}$ that lie on the first straight line r1, whilst the second and fourth reception electrodes 112, 312 have geometrical centers $Q_{r2}$, $Q_{r4}$ that lie on the second straight line r2. Likewise, also the reception reference electrode 30 can have the shape of a square with side d and geometrical center coinciding with the first central point O".

As shown in FIG. 5b, also the first, second, third, and fourth transmission electrodes 10, 110, 210, 310 can all have the shape, for example, of a square with sides of length d and parallel alternatively to the axis x' and to the axis y', and be set on the first top surface S1 in such a way that the respective geometrical centers $Q_{t1}$, $Q_{t2}$, $Q_{t3}$, $Q_{t4}$ are at the same distance from a second central point O' of the first top surface S1, for example, with distance $p_2$. In addition, the first two of these electrodes, for example, the first and third transmission electrodes 10, 210, can be set with respect to the second central point O' in a way similar to how the first and third reception electrodes 12, 212 are set with respect to the first central point O", but for a translation, respectively, equal to −d/2 and +d/2 along the axis x'. Likewise, the other two electrodes, for example, the second and fourth transmission electrodes 110, 310, can be set with respect to the second central point O' in a way similar to how the second and fourth reception electrodes 112, 312 are set with respect to the first central point O", but for a translation, respectively, equal to +d/2 and −d/2 along the axis y'. The transmission reference electrode 28 can also have the shape of a square with side d and geometrical center coinciding with the second central point O'.

In greater detail, assuming a Cartesian reference system with axes parallel to the axes of the reference system x', y', z' and centered in the second central point O', the geometrical centers $Q_{t1}$, $Q_{t2}$, $Q_{t3}$, $Q_{t4}$ have, respectively, co-ordinates equal to $(-d/2,-p_1)$, $(-p_1,d/2)$, $(d/2,p_1)$ and $(p_1,-d/2)$. In addition, we have:

$$p_2 = \sqrt{\left(\frac{d}{2}\right)^2 + p_1^2} \quad (1)$$

Defining a third straight line r3 and a fourth straight line r4, which pass through the second central point O' and are parallel, respectively, to the axes x' and y', the geometrical centers $Q_{t1-t4}$ of the first, second, third, and fourth transmission electrodes 10, 110, 210, 310 do not lie on these third and fourth straight lines r3, r4. In particular, defining an angle ρ with vertex centered in the second central point O' and such that:

$$\rho = \arctg\left(\frac{d}{2} \cdot \frac{1}{p_1}\right) \quad (2)$$

we find that the first and third geometrical centers $Q_{t1}$, $Q_{t3}$ lie on a fifth straight line r5 that forms the angle θ with the fourth straight line r4, whilst the second and fourth geometrical centers $Q_{t2}$, $Q_{t4}$ lie on a sixth straight line r6 that forms the angle ρ with the third straight line r3.

Figure 6A:
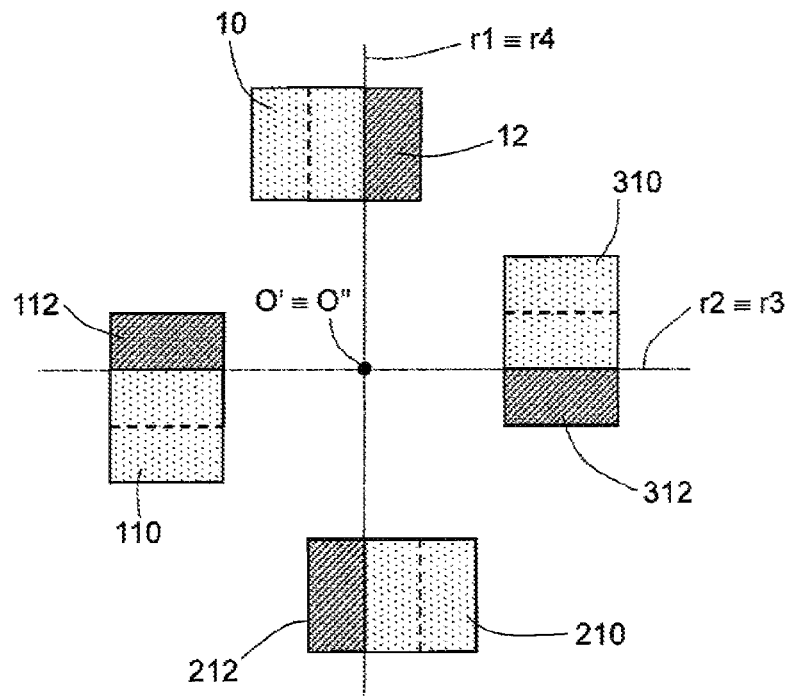
FIGS. 6a and 6b show in top plan view the first and second arrangements of electrodes appearing in FIGS. 5a and 5b, respectively, in the case where the first and second chips are aligned and misaligned.

As shown in FIG. 6a (where for reasons of simplicity the transmission reference electrode 28 and reception reference electrode 30 are not shown), in the case of alignment between the first and second chips IC1, IC2, and assuming that the first, second, third, and fourth communication signals $V_{INa}$, $V_{INb}$, $V_{INc}$, $V_{INd}$ have one and the same amplitude $V_A$, we find that the first, second, third, and fourth compensated signals $V_{OUT\_Ea}$, $V_{OUT\_Eb}$, $V_{OUT\_Ec}$, $V_{OUT\_Ed}$ have amplitude equal to $V_A/2$. In fact, in the case of alignment, i.e., in the absence of rotation and when the first and second central points O", O' are aligned with respect to one another, the capacitance of each of the first, second, third, and fourth coupling capacitors $C_{C1}$-$C_{C4}$ is equal to half the capacitance of the reference capacitor $C_{REF}$, given that the first, second, third, and fourth transmission electrodes 10, 110, 210, 310 are, respectively, superimposed on the first, second, third, and fourth reception electrodes 12, 112, 212, 312 with area of overlapping equal to $d^2/2$, i.e., to half of the area of overlapping of the transmission reference electrode 28 and reception reference electrode 30.

Figure 6B:
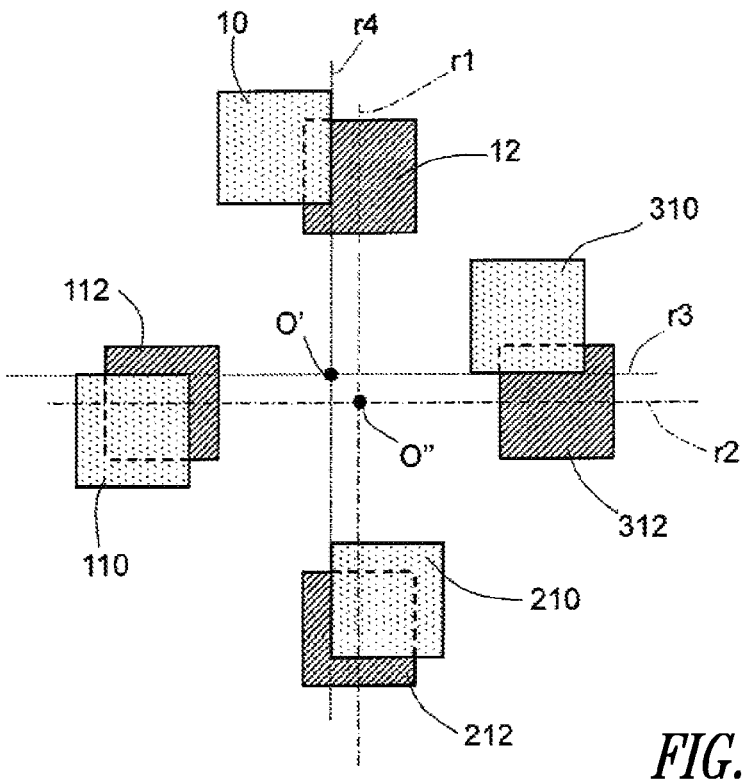

In the case of misalignment, as shown in FIG. 6b (where for reasons of simplicity the transmission reference electrode 28 and reception reference electrode 30 are not shown), each of the first, second, third, and fourth coupling capacitors $C_{C1}$-$C_{C4}$ introduce a respective capacitance, which has a respective relation with the capacitance of the reference capacitor $C_{REF}$; this relation depends upon the misalignment. Consequently, each of the first, second, third, and fourth compensated signals $V_{OUT\_Ea}$, $V_{OUT\_Eb}$, $V_{OUT\_Ec}$, $V_{OUT\_Ed}$ has an amplitude of its own, which can be greater or less than $V_A/2$, according to a direction of translation in which this misalignment occurs, which will be referred to in what follows as "direction of misalignment".

It is hence possible to detect the presence or absence of a condition of alignment considering individually each of the amplitudes of the first, second, third, and fourth compensated signals $V_{OUT\_Ea}$, $V_{OUT\_Eb}$, $V_{OUT\_Ec}$, $V_{OUT\_Ed}$, and verifying whether the amplitude considered is alternatively equal to, or greater or less than $V_A/2$. In general, even in the case where the amplitudes of the first, second, third, and fourth communication signals $V_{INa}$, $V_{INb}$, $V_{INc}$, $V_{INd}$ are not the same as one another, it is in any case possible to infer, in a way in itself known, information on the direction of misalignment. For this purpose, it is possible to compare the amplitudes of the first, second, third, and fourth compensated signals $V_{OUT\_Ea}$, $V_{OUT\_Eb}$, $V_{OUT\_Ec}$, $V_{OUT\_Ed}$, respectively, with the amplitudes of the first, second, third, and fourth communication signals $V_{INa}$, $V_{INb}$, $V_{INc}$, $V_{INd}$ divided by two.

On the basis of what is shown in FIGS. 5a, 5b, variations are in any case possible, such as variations in the shape of the electrodes, as previously described in connection with the other embodiments.

Figure 7:
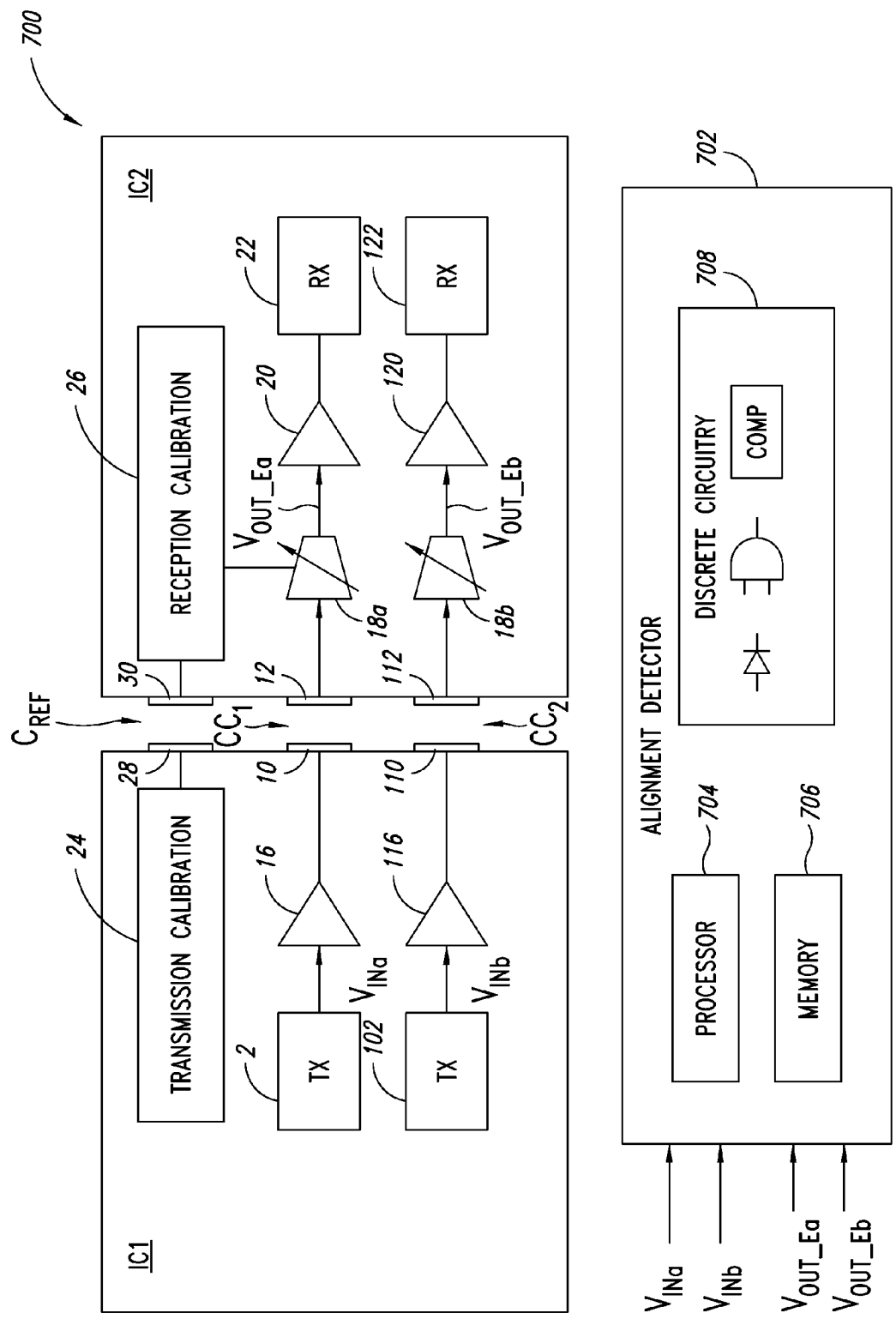
FIG. 7 is a functional block diagram of an embodiment of a system configured to determine whether a plurality of chips are aligned or misaligned.

FIG. 7 is a functional block diagram of a system 700 comprising a first integrated circuit IC1, and second integrated circuit IC2 coupled to the first integrated circuit IC1, and an alignment detector 702. In FIG. 7, similar reference numbers are used to denote elements that are similar to embodiments of the corresponding elements of FIGS. 2 and 4. The alignment detector is configured to determine whether the first integrated circuit IC1 and the second integrated circuit IC2 are properly aligned. For example, the alignment detector 702 may be configured to determine whether the first and second integrated circuits are aligned based on the amplitudes of the respective communication signals (as illustrated $V_{Ina}$, $V_{INb}$) and corresponding compensated signals (as illustrated $V_{OUT\_Ea}$, $V_{OUT\_Eb}$).

As illustrated, the alignment detector 702 comprises one or more processors 704, one or more memories 706 and discrete circuitry 708. As illustrated, the discrete circuitry comprises one or more rectifiers, one or more logic gates, and one or more comparators, but other or additional discrete circuitry may be employed. The alignment detector 702 may be configured to use one or more of the processors, memory and discrete circuitry components to determine whether the first integrated circuit IC1 and the second integrated circuit IC2 are properly aligned. The alignment detector 702 may be coupled to signals on the integrated circuits using probes, traces, and various other methods of electrically coupling components together, and various combinations thereof. As illustrated, the alignment detector 702 is separate from the first integrated circuit IC1 and the second integrated circuit IC2. In some embodiments the alignment detector may be partially or wholly integrated into one or both of the integrated circuits IC1, IC2.

The advantages that embodiments of the present disclosure may provide emerge clearly from the foregoing description. In particular, embodiments of the present disclosure do not require to know precisely the values of capacitance introduced by the coupling capacitors and by the reference capacitor, and hence enables detection of possible misalignments with a high degree of precision.

It is evident that modifications and variations may be made to the embodiments described and illustrated herein, without thereby departing from the scope of the present disclosure.

For instance, the first and second comparator stages 36, 44 can be different from the one described. By way of example, they can comprise double half-wave rectifiers. In addition, one or more of the buffers described may be absent.

Likewise, it is not necessary for the first and second chips IC1, IC2 to be set in face-to-face mode 38. Again, it is possible for the first and second reference voltages $V_{BG1}$, $V_{BG2}$ to be different, for example, because the first and second reference circuits 34, 42 are obtained in substrates of different materials.

It is possible to resort to signals of a differential type, instead of signals of a "single-ended" type.

Some embodiments may take the form of computer program products. For example, according to one embodiment there is provided a computer readable medium comprising a computer program adapted to perform one or more of the methods described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The systems, modules and data structures may also be transmitted as generated data signals (e.g., as part of a carrier wave) on a variety of computer-readable transmission mediums, including wireless-based and wired/cable-based mediums.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    communicatively coupling first and second integrated electronic devices together through a reference capacitor and a first coupling capacitor;
    transmitting a transmission reference signal on a transmission reference electrode of said reference capacitor;
    receiving a coupling signal on a reception reference electrode of said reference capacitor;
    amplifying said coupling signal, generating a reception reference signal;
    generating a reception control signal as a function of said reception reference signal;
    transmitting a first communication signal on a first transmission electrode of said first coupling capacitor;
    receiving a first reception signal on a first reception electrode of said first coupling capacitor;
    amplifying said first reception signal, generating a first compensated signal;
    controlling a level of amplification in said steps of amplifying said coupling signal and of amplifying said first reception signal as a function of said reception control signal; and
    detecting a possible misalignment between said first and second integrated electronic devices based on an amplitude of said first communication signal and an amplitude of said first compensated signal.

2. The method according to claim 1, further comprising the steps of:
    establishing an expected relation between said first communication signal and said first compensated signal; and
    determining an effective relation between the amplitude of said first communication signal and the amplitude of said first compensated signal, wherein said step of detecting comprises comparing said effective relation and said expected relation.

3. The method according to claim 2, further comprising the step of generating a reception reference voltage, wherein said step of generating a reception control signal comprises determining a difference between an amplitude of said reception reference signal and said reception reference voltage.

4. The method according to claim 3, further comprising the steps of:
    receiving a calibration signal;
    amplifying said calibration signal, generating the transmission reference signal;
    generating a transmission control signal as a function of said transmission reference signal; and
    controlling a level of amplification in said step of amplifying said calibration signal as a function of said transmission control signal.

5. The method according to claim 4, further comprising:
    generating a transmission reference voltage, wherein said step of generating a transmission control signal comprises determining a difference between an amplitude of said transmission reference signal and said transmission reference voltage.

6. The method according to claim 5 wherein said transmission reference voltage and said reception reference voltage have a same voltage level.

7. The method according to claim 5 wherein said steps of generating a transmission reference voltage and generating a reception reference voltage comprise using voltage generators of a bandgap type.

8. The method according to claim 3 wherein said step of determining a difference between an amplitude of said reception reference signal and said reception reference voltage comprises:
    generating a first current proportional to the amplitude of said reception reference signal;
    generating a second current proportional to said reception reference voltage; and
    integrating in time a current difference proportional to the difference of said first and second currents.

9. The method according to claim 1, further comprising:
    providing said transmission reference electrode and said first transmission electrode on said first integrated electronic device; and providing said reception reference electrode and said first reception electrode on said second integrated electronic device.

10. The method according to claim 9 wherein said step of providing said transmission reference electrode and said first transmission electrode comprises forming said transmission reference electrode and said first transmission electrode of a first geometrical shape, and wherein said step of providing said reception reference electrode and said first reception electrode comprises forming said reception reference electrode and said first reception electrode of a second geometrical shape.

11. The method according to claim 1, wherein said coupling step comprises providing at least one second coupling capacitor having a second transmission electrode and a second reception electrode, set, respectively, on said first and second integrated electronic devices.

12. The method according to claim 11, further comprising the steps of:
transmitting on said second transmission electrode a second communication signal;
receiving on said second reception electrode a corresponding second reception signal;
amplifying said second reception signal, generating a second compensated signal; and
controlling a level of amplification in said step of amplifying said second reception signal as a function of said reception control signal wherein said step of detecting a possible misalignment is based on an amplitude of said second communication signal and an amplitude of said second compensated signal.

13. The method according to claim 11 wherein said coupling step further comprises providing a third coupling capacitor and a fourth coupling capacitor, said third coupling capacitor having a third transmission electrode and a third reception electrode, set, respectively, on said first integrated electronic device and said second integrated electronic device, said fourth coupling capacitor having a fourth transmission electrode and a fourth reception electrode, set, respectively, on said first and second integrated electronic devices; and wherein said first, second, third, and fourth transmission electrodes surround said transmission reference electrode, are at a same distance from said transmission reference electrode, and have a first geometrical shape; and wherein said first, second, third, and fourth reception electrodes surround said reception reference electrode, are at a same distance from said reception reference electrode, and have a second geometrical shape.

14. The method according to claim 13 wherein said transmission reference electrode and said reception reference electrode have a third geometrical shape and are set in such a way that, when said first and second integrated electronic devices are aligned, they are completely superimposed; and wherein said first, second, third, and fourth transmission electrodes and said first, second, third, and fourth reception electrodes are set in such a way that, when said first and second integrated electronic devices are aligned, said first, second, third, and fourth transmission electrodes are partially superimposed, respectively, on said first, second, third, and fourth reception electrodes.

15. The method according to claim 14, further comprising:
transmitting on said second, third, and fourth transmission electrodes, respectively, a second communication signal, a third communication signal, and a fourth communication signal;
receiving on said second, third, and fourth reception electrodes, respectively, a second reception signal, a third reception signal, and a fourth reception signal;
amplifying said second, third, and fourth reception signals, generating, respectively, a second compensated signal, a third compensated signal, and a fourth compensated signal; and
controlling levels of amplification in said steps of amplifying said second, third, and fourth reception signal as a function of said reception control signal, wherein the detecting is based on amplitudes of the second, third and fourth compensated signals and amplitudes of the second, third and fourth communication signals.

16. The method of claim 15 wherein the detecting comprises comparing the amplitudes of said first, second, third, and fourth compensated signals, respectively, with the amplitudes of the first, second, third, and fourth communication signals.

17. A device, comprising:
a first integrated circuit, including:
a transmission electrode of a first coupling capacitor;
a first transmitter to transmit a time-variant first communication signal communicatively coupled to the transmission electrode of the first coupling capacitor;
a reference transmission electrode of a reference capacitor, configured to transmit a time-variant transmission reference signal; and
a second integrated circuit configured to couple to the first integrated circuit and including:
a reception electrode of the first coupling capacitor;
a first coupling variable-gain amplifier having a first input communicatively coupled to the reception electrode of the first coupling capacitor and configured to generate a first compensated signal;
a reception electrode of the reference capacitor;
a reference variable-gain amplifier having a first input communicatively coupled to the reception electrode of the reference capacitor; and
a reception gain control block coupled to an output of the reference variable-gain amplifier and configured to generate at least one gain control signal to control a gain of the first coupling variable-gain amplifier and a gain of the reference variable-gain amplifier based on the output of the reference variable-gain amplifier, wherein an amplitude of the first communication signal and an amplitude of the first compensated signal have an expected relationship when the first and second integrated circuits are aligned.

18. The device of claim 17, further comprising:
an alignment detector configured to couple to the first transmitter and the output of the first coupling variable-gain amplifier and to determine whether a relationship of the amplitude of the first communication signal and the amplitude of the first compensated signal is consistent with alignment of the first and second integrated circuits.

19. The device of claim 18 wherein the alignment detector is on the first integrated circuit.

20. The device of claim 17 wherein the reception gain control block comprises:
a bandgap block configured to generate a reception reference voltage; and
a comparator configured to determine a difference between an amplitude of the output of the second variable-gain amplifier and the reception reference voltage.

21. The device of claim 20 wherein the first integrated circuit comprises:
a transmission calibration variable-gain amplifier having a calibration signal input configured to receive a calibration signal, a control input configured to receive a gain control signal and an output communicatively coupled to the reference transmission electrode;
a comparator block coupled between the output of the transmission calibration variable-gain amplifier and the control input of the variable gain amplifier to form a feed-back loop; and
a bandgap block coupled to the comparator block and configured to provide a substantially constant reference voltage.

22. The device of claim 17, wherein the reference transmission electrode and the transmission electrode of the first coupling capacitor have a first geometrical shape, and the reception electrode of the reference capacitor and the reception electrode of the first coupling capacitor have a second geometrical shape.

23. The device of claim 17, further comprising a second coupling capacitor having a transmission electrode on the first integrated circuit and a reception electrode on the second integrated circuit, the first integrated circuit further comprising a second transmitter configured to transmit a second communication signal and the second integrated circuit further comprising a second coupling variable-gain amplifier configured to generate a second compensated signal, wherein the reception gain control block is configured to control a gain of the second coupling variable-gain amplifier based on the output of the reference variable-gain amplifier, and an amplitude of the second communication signal and an amplitude of the second compensated signal have an expected relationship when the first and second integrated circuits are aligned.

24. A device, comprising:
a first integrated circuit, including:
a plurality of transmission electrodes of a corresponding plurality of coupling capacitors, the plurality of transmission electrodes configured to transmit respective time-variant communication signals; and
a reference transmission electrode of a reference capacitor, configured to transmit a time-variant transmission reference signal; and
a second integrated circuit configured to couple to the first integrated circuit and including:
a plurality of reception electrodes of the plurality of coupling capacitors;
a plurality of coupling amplifiers communicatively coupled to respective reception electrodes of the plurality of coupling capacitors and configured to generate a plurality of compensated signals;
a reference reception electrode of the reference capacitor;
a reference amplifier having a first input communicatively coupled to the reference reception electrode of the reference capacitor; and
a reception gain control block configured to generate at least one gain control signal to control respective gains of the coupling amplifiers and of the reference amplifier based on an output of the reference amplifier, wherein amplitudes of the respective communication signals and corresponding compensated signals have corresponding expected relationships when the first and second integrated circuits are aligned.

25. The device of claim 24 wherein:
the plurality of transmission electrodes surround the reference transmission electrode, have a first shape and are each a first distance from the reference transmission electrode; and
the plurality of reception electrodes surround the reference reception electrode, have a second shape and are each a second distance from said reference reception.

26. The device of claim 25 wherein the reference transmission electrode and the reference reception electrode have a third shape and, when the first and second integrated circuits are aligned, the reference transmission electrode and the reference reception electrode are superimposed and the respective transmission electrodes and reception electrodes of the plurality of coupling capacitors and partially superimposed.

27. The device of claim 24, further comprising:
an alignment detector configured to determine whether the first and second integrated circuits are aligned based on the amplitudes of the respective communication signals and corresponding compensated signals.

28. A system, comprising:
a first integrated circuit, including:
means for generating a time-variant first communication signal;
means for transmitting the time-variant first communication signal;
means for generating a time-variant reference transmission signal;
means for transmitting the time-variant reference transmission signal;
a second integrated circuit configured to couple to the first integrated circuit and including:
means for receiving the transmitted time-variant first communication signal;
means for generating a first compensated signal from the received first communication signal;
means for receiving the transmitted reference transmission signal;
means for generating a reception reference signal based on the received reference transmission signal; and
means for controlling a gain of the means for generating a first compensated signal and of the means for generating a reception reference signal based on the reception reference signal; and
means for determining whether the first and second integrated circuits are aligned based on amplitudes of the first communication signal and of the first compensated signal.

29. The system of claim 28 wherein the means for determining is on the first integrated circuit.

30. A non-transitory computer-readable medium whose contents cause at least one electronic device to perform a method, the method comprising:
transmitting a transmission reference signal on a transmission reference electrode of a reference capacitor;
receiving a coupling signal on a reception reference electrode of said reference capacitor;
amplifying said coupling signal, generating a reception reference signal;
generating a reception control signal as a function of said reception reference signal;
transmitting a first communication signal on a first transmission electrode of a first coupling capacitor;
receiving a first reception signal on a first reception electrode of said first coupling capacitor;
amplifying said first reception signal, generating a first compensated signal;

controlling a level of amplification of amplifying said coupling signal and of amplifying said first reception signal as a function of said reception control signal; and detecting a possible misalignment between first and second integrated electronic devices based on an amplitude of said first communication signal and an amplitude of said first compensated signal.

31. The non-transitory computer readable medium of claim 30 wherein the method further comprises:

establishing an expected relation between said first communication signal and said first compensated signal; and determining an effective relation between the amplitude of said first communication signal and the amplitude of said first compensated signal, wherein said step of detecting comprises comparing said effective relation and said expected relation.

32. The non-transitory computer readable medium of claim 30 wherein the method further comprises: generating a reception reference voltage, and wherein said step of generating a reception control signal comprises determining a difference between an amplitude of said reception reference signal and said reception reference voltage.

33. The non-transitory computer readable medium of claim 32 wherein the method further comprises:

receiving a calibration signal;

amplifying said calibration signal, generating the transmission reference signal;

generating a transmission control signal as a function of said transmission reference signal; and controlling a level of amplification in said step of amplifying said calibration signal as a function of said transmission control signal.

34. The non-transitory computer readable medium of claim 33 wherein the method further comprises:

generating a transmission reference voltage, wherein said step of generating a transmission control signal comprises determining a difference between an amplitude of said transmission reference signal and said transmission reference voltage.

* * * * *